United States Patent
Adaniya et al.

(10) Patent No.: US 8,980,121 B2
(45) Date of Patent: Mar. 17, 2015

(54) ETCHING LIQUID FOR A COPPER/TITANIUM MULTILAYER THIN FILM

(75) Inventors: Tomoyuki Adaniya, Tokyo (JP); Satoshi Okabe, Chiba (JP); Toshiyuki Gotou, Kanagawa (JP); Taketo Maruyama, Niigata (JP); Kazuki Kobayashi, Osaka (JP); Keiichi Tanaka, Osaka (JP); Wataru Nakamura, Osaka (JP); Kenichi Kitoh, Osaka (JP); Tetsunori Tanaka, Osaka (JP)

(73) Assignees: Mitsubishi Gas Chemical Company, Inc., Tokyo (JP); Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 13/575,767

(22) PCT Filed: Jan. 28, 2011

(86) PCT No.: PCT/JP2011/051744
§ 371 (c)(1),
(2), (4) Date: Nov. 5, 2012

(87) PCT Pub. No.: WO2011/093445
PCT Pub. Date: Aug. 4, 2011

(65) Prior Publication Data
US 2013/0048904 A1 Feb. 28, 2013

(30) Foreign Application Priority Data
Jan. 28, 2010 (JP) .................. 2010-016720

(51) Int. Cl.
*B44C 1/22* (2006.01)
*C23F 1/00* (2006.01)
(Continued)

(52) U.S. Cl.
CPC ............ *H01L 21/32134* (2013.01); *C23F 1/18* (2013.01); *C23F 1/26* (2013.01); *C23F 1/44* (2013.01); *H05K 3/067* (2013.01); *H01L 23/53238* (2013.01); *H01L 2924/0002* (2013.01)
USPC ............. 252/79.3; 252/79.1; 216/52; 216/53; 216/90; 216/92; 438/689; 438/745; 438/747; 438/754

(58) Field of Classification Search
None
See application file for complete search history.

(56) References Cited

U.S. PATENT DOCUMENTS 4,917,758 A * 4/1990 Ishizuka et al. ................. 216/20
6,821,352 B2 * 11/2004 Rovito et al. ..................... 134/3

(Continued)

FOREIGN PATENT DOCUMENTS

JP 51 27819 3/1976
JP 2000 297387 10/2000

(Continued)

OTHER PUBLICATIONS

International Search Report Issued Apr. 5, 2011 in PCT/JP11/051744 Filed Jan. 28, 2011.

(Continued)

*Primary Examiner* — Stephanie Duclair
(74) *Attorney, Agent, or Firm* — Oblon, McClelland, Maier & Neustadt, L.L.P.

(57) ABSTRACT

The present invention provides an etching liquid for a multilayer thin film containing a copper layer and a titanium layer, and a method of using it for etching a multilayer thin film containing a copper layer and a titanium layer, that is, an etching liquid for a multilayer thin film containing a copper layer and a titanium layer, which comprises (A) hydrogen peroxide, (B) nitric acid, (C) a fluoride ion source, (D) an azole, (E) a quaternary ammonium hydroxide and (F) a hydrogen peroxide stabilizer and has a pH of from 1.5 to 2.5, and a etching method of using it.

18 Claims, 1 Drawing Sheet

Top CD Loss : a×2 (μm)

Bottom CD Loss : b×2 (μm)

Barrier Layer Tailing : c (μm)

(51) Int. Cl.

| | |
|---|---|
| *C03C 15/00* | (2006.01) |
| *C03C 25/68* | (2006.01) |
| *H01L 21/302* | (2006.01) |
| *H01L 21/461* | (2006.01) |
| *C09K 13/00* | (2006.01) |
| *C09K 13/08* | (2006.01) |
| *H01L 21/3213* | (2006.01) |
| *C23F 1/18* | (2006.01) |
| *C23F 1/26* | (2006.01) |
| *C23F 1/44* | (2006.01) |
| *H05K 3/06* | (2006.01) |
| *H01L 23/532* | (2006.01) |

(56) References Cited

U.S. PATENT DOCUMENTS

| | | | |
|---|---|---|---|
| 7,008,548 B2 | 3/2006 | Chae et al. | |
| 2001/0032829 A1* | 10/2001 | Honda et al. | 216/108 |
| 2002/0106458 A1 | 8/2002 | Montano et al. | |
| 2004/0161545 A1 | 8/2004 | Montano et al. | |
| 2005/0061202 A1* | 3/2005 | Hosomi et al. | 106/31.65 |
| 2005/0170077 A1 | 8/2005 | Montano et al. | |
| 2009/0286360 A1* | 11/2009 | Jo et al. | 438/149 |

FOREIGN PATENT DOCUMENTS

| | | |
|---|---|---|
| JP | 2002 302780 | 10/2002 |
| JP | 2002 317281 | 10/2002 |
| JP | 2004 43850 | 2/2004 |
| JP | 2008 288575 | 11/2008 |
| JP | 2009 191357 | 8/2009 |

OTHER PUBLICATIONS

U.S. Appl. No. 13/578,696, filed Aug. 15, 2012, Okabe et al.
U.S. Appl. No. 14/235,290, filed Jan. 27, 2014, Okabe et al.

* cited by examiner

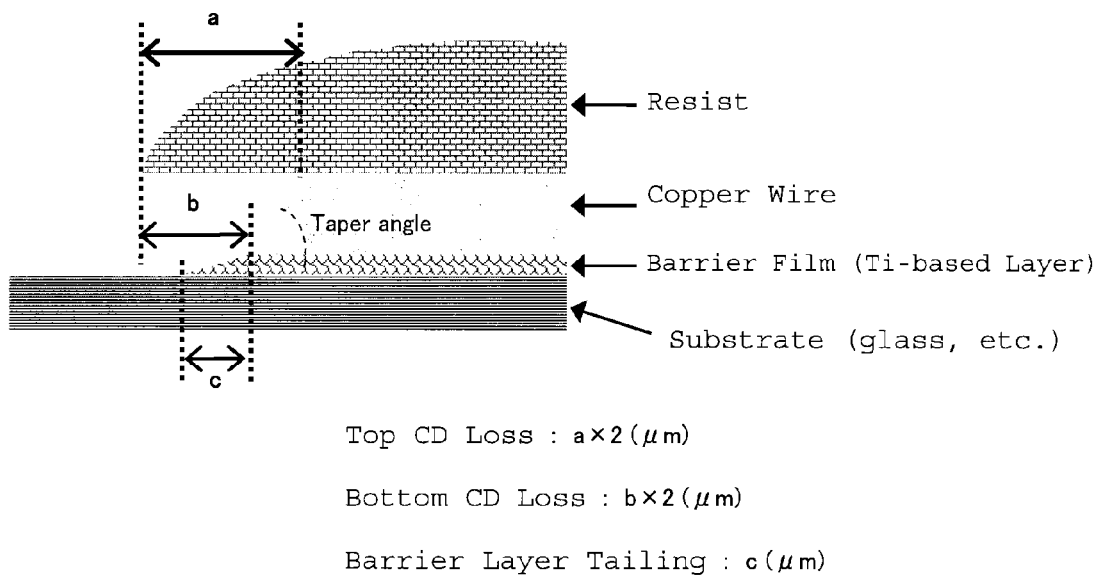

ETCHING LIQUID FOR A COPPER/TITANIUM MULTILAYER THIN FILM

TECHNICAL FIELD

The present invention relates to an etching liquid for a multilayer thin film containing a copper layer and a titanium layer, and to an etching method using it. In particular, the etching liquid of the present invention is favorably used for etching of a multilayer thin film having a copper layer provided on a titanium layer.

BACKGROUND ART

Heretofore, aluminium or an aluminium alloy has been generally used as the wiring material for display devices such as flat panel displays, etc. However, with growing in size and increasing in resolution of displays, there has occurred a problem of RC delay caused by the characteristics such as the wiring resistance of such aluminium-based wiring materials and uniform panel displaying has tended to be difficult.

Given the situation, the recent tendency is toward investigation of employing copper or copper-based wiring with a material having a lower resistance. However, copper has an advantage in that its resistance is low but, on the other hand, has a problem in that, in use for gate wiring, the adhesiveness between the substrate such as glass or the like and copper is not sufficient and that, in use for source/drain wiring, copper may diffuse into the silicon semiconductor underlayer. Consequently, for preventing these, there has been made an investigation of barrier layer lamination with a metal that has high adhesion to a substrate such as glass or the like, and hardly diffuses into the silicon semiconductor underlayer and additionally has a barrier property; and as the metal, titanium-based metals such as titanium (Ti) and titanium nitride (TiN) have become specifically noted.

A multilayer film that contains copper or a copper-based copper alloy is formed on a substrate of glass or the like according to a film formation process of a sputtering method or the like, and then processed in an etching process of etching it via a resist serving as a mask to give an electrode pattern. The etching process includes a wet etching mode of using an etching liquid and a dry etching mode of using an etching gas of plasma or the like. The etching liquid for use in the wet mode is desired to satisfy the following: (i) The processing accuracy is high, (ii) the amount of the etching residue is small, (iii) the etching unevenness level is low, and (iv) the etching ability to dissolve the metal of the copper-containing wiring material to be etched is stable; and in addition to these, for meeting the size enlargement and the resolution enhancement of displays, (v) the wiring configuration formed after etching could fall within a predetermined range, or that is, a good wiring configuration can be obtained. More concretely, the parameters shown in FIG. 1 are desired to be as follows: The angle (taper angle) between the etched face of the copper wiring edge and the underlayer substrate is from 20 to 60°, or that is, the angle is a regular taper angle; the distance between the resist edge and the wire edge to be in contact with the resist (top CD loss, a×2) is at most 3 μm, the distance between the resist edge and the wire edge to be in contact with the barrier layer provided below the wire (bottom CD loss, b×2) is at most 1 μm, and the barrier film tailing (c) is not more than b.

As the etching liquid to be used in the etching process for the multilayer film containing copper or a copper-based copper alloy, for example, there have been proposed an etching solution containing at least one selected from a neutral salt, an inorganic acid and an organic acid, and hydrogen peroxide and a hydrogen peroxide stabilizer (for example, Patent Reference 1), an etching solution containing hydrogen peroxide, an organic acid and fluorine (for example, Patent Reference 2), etc.

However, these are all unsatisfactory in point of the wiring profile after etching therewith and, as a result, could not often sufficiently meet the size enlargement and the resolution enhancement of displays.

CITATION LIST

Patent References

Patent Reference 1: JP-A 2002-302780
Patent Reference 2: U.S. Pat. No. 7,008,548

BRIEF DESCRIPTION OF THE DRAWING

FIG. 1 This is a schematic view of a wiring cross section that has a multilayer thin film containing a copper layer and a titanium layer, as etched with the etching liquid of the present invention.

DISCLOSURE OF THE INVENTION

Problems that the Invention is to Solve

The present invention has been made under the circumstances as above, and its object is to provide an etching liquid for a multilayer thin film containing a copper layer and a titanium layer, and a method of using it for etching a multilayer thin film containing a copper layer and a titanium layer.

Means for Solving the Problems

The present inventors have repeatedly made assiduous studies for attaining the above-mentioned object and, as a result, have found that, when a specific combination of (A) hydrogen peroxide, (B) nitric acid, (C) a fluoride ion source, (D) an azole, (E) a quaternary ammonium hydroxide and (F) a hydrogen peroxide stabilizer is incorporated to prepare an etching liquid, then the object can be thereby attained.

The present invention has been completed on the basis of the finding. Specifically, the gist of the present is as follows:
[1] An etching liquid for a multilayer thin film containing a copper layer and a titanium layer, which comprises (A) hydrogen peroxide, (B) nitric acid, (C) a fluoride ion source, (D) an azole, (E) a quaternary ammonium hydroxide and (F) a hydrogen peroxide stabilizer and has a pH of from 1.5 to 2.5.
[2] The etching liquid of the above 1, wherein the fluoride ion source (C) is ammonium fluoride and/or acidic ammonium fluoride.
[3] The etching liquid of the above 1 or 2, wherein the azole (D) is 5-amino-1H-tetrazole.
[4] The etching liquid of any of the above 1 to 3, wherein the quaternary ammonium hydroxide (E) is tetraalkylammonium hydroxide and/or (hydroxyalkyl)trialkylammonium hydroxide.
[5] The etching liquid of any of the above 1 to 4, wherein the hydrogen peroxide stabilizer (F) is phenylurea and/or phenolsulfonic acid.
[6] The etching liquid of any of the above 1 to 5, containing from 4.5 to 7.5% by mass of hydrogen peroxide (A), from 3 to 6% by mass of nitric acid (B), from 0.1 to 0.5% by mass of a fluoride ion source (C), from 0.1 to 0.5% by mass of an azole (D), from 3 to 6% by mass of a quaternary ammonium hydroxide (E), and from 0.01 to 0.1% by mass of a hydrogen peroxide stabilizer (F).

[7] The etching liquid of any of the above 1 to 6, wherein the multilayer thin film is one formed by laminating a copper layer on a titanium layer.

[8] A method for etching a multilayer thin film containing a copper layer and a titanium layer, which comprises bringing a subject to be etched into contact with the etching liquid of any of the above 1 to 6.

[9] The etching method of the above 8, wherein the multilayer thin film is one formed by laminating a copper layer on a titanium layer.

Advantage of the Invention

According to the present invention, there are provided an etching liquid which secures, in an etching process for a multilayer thin film containing a copper layer and a titanium layer, high processing accuracy, little etching residue and unevenness and a long bath life, and realizes a good wiring profile after etching therewith, and which therefore can meet the requirement of size enlargement and resolution enhancement of displays, and an etching method using it for a multilayer thin film containing a copper layer and a titanium layer. According to the etching method, a wiring material that contains a multilayer thin film containing a copper layer and a titanium layer can be etched all at a time, and therefore, after etching therewith, a good wiring profile can be realized at high producibility.

BEST MODE FOR CARRYING OUT THE INVENTION

[Etching Liquid for Multilayer Thin Film Containing Copper Layer and Titanium Layer]

The etching liquid of the present invention is used for etching of a multilayer thin film containing a copper layer and a titanium layer, and the liquid comprises (A) hydrogen peroxide, (B) nitric acid, (C) a fluoride ion source, (D) an azole, (E) a quaternary ammonium hydroxide and (F) a hydrogen peroxide stabilizer and has a pH of from 1.5 to 2.5.

<<(A) Hydrogen Peroxide>>

Hydrogen peroxide for use in the etching liquid of the present invention has the function of oxidizing a copper wire, serving as an oxidizing agent, and the content thereof in the etching liquid is preferably from 3 to 10% by mass, more preferably from 4.5 to 7.5% by mass. The content of hydrogen peroxide falling within the above range is preferred, as securing a suitable etching rate and facilitating good control of the etching amount with no risk of local corrosion of copper wires.

<<(B) Nitric Acid>>

Nitric acid for use in the etching liquid of the present invention contributes toward dissolution of copper oxidized by hydrogen peroxide (A), and the content thereof in the etching liquid is preferably from 2 to 10% by mass, more preferably from 3 to 6% by mass. When the content of nitric acid falls within the above range, a suitable etching rate can be secured and a good wiring profile can be obtained after etching.

Any other mineral acid than nitric acid, for example, phosphoric acid, sulfuric acid or the like may be used in the etching liquid of the present invention within a range not detracting from the effect of the etching liquid of the present invention.

<<(C) Fluoride Ion Source>>

The fluoride ion source for use in the etching liquid of the present invention contributes toward etching of the barrier film formed of a titanium-type metal, and the content thereof in the etching liquid is preferably from 0.05 to 1% by mass, more preferably from 0.1 to 0.5% by mass. When the content of the fluoride ion source falls within the above range, then a good etching rate for the barrier film formed of a titanium-based metal can be secured with no increase in the corrosion rate for the substrate of glass or the like.

Not specifically defined, the fluorine ion source may be any one capable of generating a fluoride ion in the etching liquid. Preferably mentioned are hydrofluoric acid, ammonium fluoride, acidic ammonium fluoride, etc.; and one or more of these may be used here either singly or as combined. Of those, more preferred are ammonium fluoride and/or acidic ammonium fluoride from the viewpoint of the low toxicity thereof.

<<(D) Azole>>

As the azole for use in the etching liquid of the present invention, preferably mentioned are triazoles such as 1,2,4-triazole, 1H-benzotriazole, 5-methyl-1H-benzotriazole, 3-amino-1H-triazole, etc.; tetrazoles such as 1H-tetrazole, 5-methyl-1H-tetrazole, 5-phenyl-1H-tetrazole, 5-amino-1H-tetrazole, etc.; thiazoles such as 1,3-thiazole, 4-methylthiazole, etc. Of those, preferred are tetrazoles, and especially preferred is 5-amino-1H-tetrazole.

The content of the azole in the etching liquid is preferably from 0.05 to 1% by mass, more preferably from 0.1 to 0.5% by mass. When the content of the azole falls within the above range, then the etching rate for copper wiring can be suitably controlled to give a good wiring profile after etching.

<<(E) Quaternary Ammonium Hydroxide>>

As the quaternary ammonium hydroxide for use in the etching liquid of the present invention, preferably, there are mentioned tetraalkylammonium hydroxide, and (hydroxyalkyl)trialkylammonium hydroxide. The alkyl group may be any of a linear, branched or cyclic one having from 1 to 8 carbon atoms, and preferably, for example, there are mentioned a methyl group, an ethyl group, an n-propyl group, an isopropyl group, an n-butyl group, an isobutyl group, a sec-butyl group, a tert-butyl group, various pentyl groups, various hexyl groups, various octyl groups, a cyclopentyl group, a cyclohexyl group, etc. The alkyl groups may be the same or different, and from the viewpoint of prolonging the bath life of the etching liquid, preferred is an alkyl group having from 1 to 4 carbon atoms, and more preferred is a methyl group. Namely, as the tetraalkylammonium hydroxide, preferred is tetramethylammonium hydroxide; and as the (hydroxyalkyl)trialkylammonium hydroxide, preferred is (2-hydroxyethyl)trimethylammonium hydroxide. In the present invention, one or more of these may be used either singly or as combined.

The content of the quaternary ammonium hydroxide in the etching liquid is preferably from 2 to 10% by mass, more preferably from 3 to 6% by mass. When the content of the quaternary ammonium hydroxide falls within the above range, then the bath life of the etching liquid can be sufficiently long.

<<(F) Hydrogen Peroxide Stabilizer>>

The etching liquid of the present invention contains a hydrogen peroxide stabilizer. Not specifically defined, any one generally used as a hydrogen peroxide stabilizer is usable here with no limitation; however, as the hydrogen peroxide stabilizer for use herein, preferably mentioned are urea-based hydrogen peroxide stabilizers such as phenylurea, allylurea, 1,3-dimethylurea, thiourea, etc., as well as phenylacetamide, phenylethylene glycol, phenolsulfonic acid, etc. Above all, preferred are phenylurea and phenolsulfonic acid. In the present invention, one or more of these may be used either singly or as combined.

The content of the hydrogen peroxide stabilizer (F) in the etching liquid of the present invention is preferably from 0.01 to 0.1% by mass from the viewpoint of sufficiently securing the addition effect thereof.

<<pH>>

The etching liquid of the present invention must have a pH of from 1.5 to 2.5. When its pH is lower than 1.5, then the etching rate is too high so that there may occur local corrosion in the copper wire to etch ununiformly therein. On the other hand, when the pH is higher than 2.5, then the stability of the hydrogen peroxide (A) may lower whereby the etching rate for copper wiring may lower and the bath life of the etching liquid may shorten.

<<Other Components>>

In addition to the above-mentioned components (A) to (F), the etching liquid of the invention may contain water and other various additives generally used in ordinary etching liquids within a range not detracting from the effect of the etching liquid. As water, preferred is one processed through distillation, ion-exchange treatment, filtration, various adsorption treatments or the like, in which, therefore, metal ions, organic impurities, particles and the like are removed; and more preferred are pure water and ultrapure water.

[Etching Method for Multilayer Thin Film Containing Copper Layer and Titanium Layer]

The etching method of the present invention is a method for etching a multilayer thin film that contains a copper layer and a titanium layer, and is characterized in that the etching liquid of the present invention, or that is, the etching liquid for a multilayer thin film containing a copper layer and a titanium layer, which comprises (A) hydrogen peroxide, (B) nitric acid, (C) a fluoride ion source, (D) an azole, (E) a quaternary ammonium hydroxide and (F) a hydrogen peroxide stabilizer and has a pH of from 1.5 to 2.5, is used and that the method comprises a step of bringing a subject to be etched into contact with the etching liquid of the present invention. According to the etching method of the present invention, a multilayer thin film containing a copper layer and a titanium layer can be etched all at a time to give a good wiring profile after etching.

In the etching method of the present invention, the subject to be etched with the etching liquid is one, for example, as shown in FIG. 1, in which a barrier film (titanium layer) formed of a titanium-based material and a copper wire (copper layer) formed of copper or a copper-based material are laminated in that order on a substrate of glass or the like to form a multilayer thin film containing the copper layer and the titanium layer, a resist is further applied thereonto, and a desired pattern mask is transferred on it through exposure and development to form a desired resist pattern thereon. In the present invention, the multilayer thin film containing a copper layer and a titanium layer includes an embodiment where the copper layer exists on the titanium layer as in FIG. 1, and also an embodiment where the titanium layer exists on the copper layer. In the etching method of the present invention, the subject to be etched is preferably one where a copper layer exists on a titanium layer as shown in FIG. 1, from the viewpoint that the etching liquid of the present invention can effectively display the performance thereof. The multilayer thin film of the type containing a copper layer and a titanium layer is favorably used in wiring in display devices such as flat panel displays, etc. Consequently, the subject to be etched in which a copper layer exists on a titanium layer is a favorable embodiment from the viewpoint of the industrial applicability thereof.

Not specifically defined, the copper wiring may be formed of copper or a copper-based material, and as the titanium-based alloy to form the barrier film, there may be mentioned Ti (titanium) and its nitride, TiN (titanium nitride).

The method of bringing the subject to be etched into the etching liquid is not specifically defined; and herein employable is a wet etching method, for example, a method of dripping the etching liquid onto the subject (sheet-fed spin treatment) or spraying it thereonto, or a method of dipping the subject into the etching liquid, etc. In the present invention, preferably employed is the method of bringing the etching liquid into contact with the subject by spraying it onto the latter.

The temperature at which the etching liquid is used is preferably from 10 to 70° C., more preferably from 20 to 50° C. When the temperature of the etching liquid is not lower than 10° C., then the etching rate is not so much lowered and the production efficiency is not extremely lowered. On the other hand, when the temperature is not higher than 70° C., then the liquid composition change could be prevented and the etching condition could be kept constant. Elevating the temperature of the etching liquid could increase the etching rate, but in consideration of the object of reducing the composition change of the etching liquid, the best treatment temperature may be suitably determined.

In the etching method of the present invention, the hydrogen peroxide (A) and the nitric acid (B) contained in the etching liquid are, as described above, individually consumed as the oxidizing agent for copper wires. In addition, the nitric acid (B) is also consumed for dissolution of the oxidized copper, and therefore the performance of the etching liquid may lower owing to the reduction in the concentration of the hydrogen peroxide (A) and the nitric acid (B) in the etching liquid used. In such a case, hydrogen peroxide (A) and nitric acid (B) may be simultaneously or separately added so as to prolong the bath life of the etching liquid.

EXAMPLES

Next, the present invention is described further in detail by Examples; however, the present invention is not whatsoever restricted by these Examples.

(Observation of Cross Section of Multilayer Thin Film Containing Copper Layer and Titanium Layer after Etching)

A sample of the etched multilayer thin film containing a copper layer and a titanium layer, as obtained in Examples and Comparative Examples, was cut and observed with a 50000 magnification through scanning electronic microscope ("S5000H Type (Model Number)", by Hitachi) (acceleration voltage 2 kV, acceleration current 10 µA). On the thus-taken SEM image, the taper angle, the top CD loss (µm), the bottom CD loss (µm) and the barrier film tailing (µm) as shown in FIG. 1 were determined.

Samples of which the taper angle, the top CD loss (µm), the bottom CD loss (µm) and the barrier film tailing (µm) each were within the standard range shown in Table 1 were considered to be good, and the performance of the etching liquid was thereby determined. In the Table, the initial bath means that copper is not as yet dissolved in the etching liquid; and metal dissolution means that the amount of copper dissolved in the etching liquid in the bath life evaluation to be mentioned below is the acceptable maximum dissolution amount.

(Bath Life Evaluation)

Each sample was etched, and the amount of copper dissolved in the etching liquid just before any of the taper angle, the top CD loss (μm), the bottom CD loss (μm) and the barrier film tailing (μm) of the etched sample came to fall outside the standard range shown in Table 2 was taken as the acceptable maximum dissolution amount, and the bath life of the sample was thereby evaluated.

(Glass Corrosion Rate)

Each sample of Examples and Comparative Examples was analyzed with a contact roughness meter ("SV-2100 (Model Number)", by Mitsutoyo) to measure the level difference between the corroded part and the non-corroded part, and the corrosion rate was thereby determined.

TABLE 1

|  |  | Initial Bath | Metal Dissolution |
|---|---|---|---|
| Top CD Loss (= a × 2) | (μm) | 3 or less | initial bath ± 0.5 |
| Bottom CD Loss (= b × 2) | (μm) | 1 or less | initial bath ± 0.5 |
| Barrier Film Tailing (= c) | (μm) |  | b or less |
| Taper Angle (°) |  |  | 20 to 60 |
| Glass Corrosion Rate | nm/min |  | 40 or less |

Production Example

Production of Multilayer Thin Film Containing Copper Layer and Titanium Layer

Titanium (Ti) was sputtered onto a substrate of glass to thereby form a barrier film of titanium (titanium layer) thereon, then a copper-based material was sputtered thereonto to form a wiring material film (copper layer), then a resist was applied onto it, a pattern mask was transferred through exposure thereonto, and developed to form a wiring pattern, thereby producing a multilayer thin film containing a copper layer and a titanium layer in which the copper layer was laminated on the titanium layer.

Examples 1 to 10

The multilayer thin film containing a copper layer and a titanium layer, as produced in Production Example, was etched with the etching liquid shown in Table 2, at 35° C. for 60 to 150 seconds, thereby giving an etched, multilayer thin film sample containing a copper layer and a titanium layer, and the amount of the metal dissolved in the etching liquid was measured. Thus processed, the sample was analyzed according to the above-mentioned method to measure the taper angle, the top CD loss (μm), the bottom CD loss (μm) and the barrier film tailing (μm) in the initial bath. In case where the data in this stage still fell within the standard range in Table 1, still another new multilayer thin film containing a copper layer and a titanium layer was etched in the bath, and this process was repeated here. At the time when any of these numerical data came to fall outside the standard range in Table 1, the etching treatment was finished. The amount of the metal dissolved in the etching solution used in the last bath in which all the numerical data fell within the standard range was measured, and this is the acceptable maximum dissolution amount of copper in the etching liquid. Based on the found data, the bath life of the etching liquid was thereby evaluated. The obtained evaluation is shown in Tables 2 and 3.

TABLE 2

|  |  | Example | | | | |
|---|---|---|---|---|---|---|
|  |  | 1 | 2 | 3 | 4 | 5 |
| Etching Liquid |  | 1 | 2 | 3 | 4 | 5 |
| (A) Hydrogen Peroxide[*1] | (% by mass) | 5.8 | 5.8 | 5.8 | 4.7 | 7.0 |
| (B) Nitric Acid[*2] | (% by mass) | 4 | 4 | 3.8 | 3.2 | 4.8 |
| (C) Fluoride Ion Source[*3] | (% by mass) | 0.25 | 0.25 | 0.25 | 0.20 | 0.30 |
| (D) Azole[*4] | (% by mass) | 0.2 | 0.2 | 0.2 | 0.1 | 0.3 |
| (E) Quaternary Ammonium Hydroxide[*5] | (% by mass) | 4.1 | 4.6 | 4.8 | 3.5 | 5.8 |
| (F) Hydrogen Peroxide Stabilizer[*6] | (% by mass) | 0.03 | 0.03 | 0.03 | 0.02 | 0.04 |
| Water | (% by mass) | balance | balance | balance | balance | balance |
| pH |  | 1.6 | 1.8 | 2.2 | 1.9 | 1.8 |
| Taper Angle (initial bath/after dissolution) |  | 32/31 | 29/31 | 32/30 | 29/32 | 30/32 |
| Top CD Loss (initial bath/after dissolution) |  | 1.80/1.90 | 1.69/1.90 | 1.90/1.90 | 1.38/1.51 | 1.87/2.03 |
| Bottom CD Loss (initial bath/after dissolution) |  | 0.65/0.76 | 0.64/0.76 | 0.75/0.76 | 0.0/0.0 | 0.52/0.64 |
| Barrier Film Tailing (initial bath/after dissolution) |  | 0.20/0.25 | 0.21/0.26 | 0.21/0.24 | 0.0/0.0 | 0.18/0.25 |
| Evaluation of Bath Life (ppm) |  | 4000 | 3000 | 2500 | 3000 | 4000 |
| Glass Corrosion Rate (nm/min) |  | 26 | 25 | 26 | 26 | 28 |

[*1]: by Mitsubishi Gas Chemical

[*2]: by Wako Pure Chemical Industry

[*3]: acidic ammonium fluoride, by Morita Chemical Industry

[*4]: 5-amino-1H-tetrazole, by Wako Pure Chemical Industry

[*5]: tetramethylammonium hydroxide, by Tama Chemicals

[*6]: phenylurea, by Wako Pure Chemical Industry

TABLE 3

| | Etching Liquid | | Example 6 / 6 | Example 7 / 7 | Example 8 / 8 | Example 9 / 9 | Example 10 / 10 | Example 11 / 11 |
|---|---|---|---|---|---|---|---|---|
| (A) | Hydrogen Peroxide*[1] | (% by mass) | 5.8 | 5.8 | 5.8 | 5.8 | 5.8 | 5.8 |
| (B) | Nitric Acid*[2] | (% by mass) | 4 | 4 | 4 | 4 | 4 | 4 |
| (C) | Fluoride Ion Source*[3] | (% by mass) | — | — | 0.25 | 0.25 | 0.25 | 0.25 |
| | Fluoride Ion Source*[7] | (% by mass) | 0.3 | — | — | — | — | — |
| | Fluoride Ion Source*[8] | (% by mass) | — | 0.2 | — | — | — | — |
| (D) | Azole*[4] | (% by mass) | 0.2 | 0.2 | — | — | 0.2 | 0.2 |
| | Azole*[9] | (% by mass) | — | — | 0.3 | 0.5 | — | — |
| (E) | Quaternary Ammonium Hydroxide*[5] | (% by mass) | 4.6 | 4.6 | 4.6 | 4.6 | — | 4.6 |
| | Quaternary Ammonium Hydroxide*[10] | | — | — | — | — | 5.3 | — |
| (F) | Hydrogen Peroxide Stabilizer*[6] | (% by mass) | 0.03 | 0.03 | 0.03 | 0.03 | 0.03 | — |
| | Hydrogen Peroxide Stabilizer*[11] | (% by mass) | — | — | — | — | — | 0.1 |
| | Water | (% by mass) | balance | balance | balance | balance | balance | balance |
| | pH | | 1.6 | 1.7 | 1.8 | 1.8 | 1.5 | 1.7 |
| | Taper Angle (initial bath/after dissolution) | | 32/31 | 32/30 | 28/35 | 26/29 | 25/30 | 32/35 |
| | Top CD Loss (initial bath/after dissolution) | | 1.80/1.90 | 1.75/1.90 | 2.75/2.90 | 2.07/2.30 | 1.75/1.77 | 2.00/2.10 |
| | Bottom CD Loss (initial bath/after dissolution) | | 0.65/0.76 | 0.64/0.76 | 1.0/1.48 | 0.73/0.85 | 0.50/0.52 | 1.10/1.30 |
| | Barrier Film Tailing (initial bath/after dissolution) | | 0.20/0.25 | 0.21/0.25 | 0.25/0.50 | 0.32/0.46 | 0.17/0.18 | 0.25/0.28 |
| | Evaluation of Bath Life (ppm) | | 4000 | 3500 | 3000 | 4000 | 3000 | 4000 |
| | Glass Corrosion Rate (nm/min) | | 26 | 26 | 26 | 26 | 26 | 26 |

*[7]ammonium fluoride, by Morita Chemical Industry
*[8]hydrofluoric acid, by Morita Chemical Industry
*[9]1,2,4-triazole, by Wako Pure Chemical Industry
*[10](2-hydroxyethyl)trimethylammonium hydroxide, by Wako Pure Chemical Industry
*[11]phenolsulfonic acid, by Wako Pure Chemical Industry Comparative Examples 1 to 6

Samples were etched in the same manner as in Example 1, except that the etching liquid comprising the components shown in Table 4 was used in Example 1. The taper angle, the top CD loss (μm), the bottom CD loss (μm), the barrier film tailing (μm), the evaluation of bath life and glass corrosion rate of the obtained multilayer thin film containing a copper layer and a titanium layer are shown in Table 4.

In Examples where the etching liquid of the present invention was used, the wiring profile after etching was good, and the etching liquid used exhibited excellent results in point of evaluation of bath life and glass corrosion. On the other hand, in Comparative Example 1 in which the etching liquid used did not contain the components (E) and (F), glass corrosion could be prevented but the bath life was 500 ppm and short and was not sufficient as compared with the long bath life in Examples of 2500 ppm or more, 3000 ppm or more or 4000

TABLE 4

| | Etching Liquid | | Comp. Ex. 1 / 12 | Comp. Ex. 2 / 13 | Comp. Ex. 3 / 14 | Comp. Ex. 4 / 15 | Comp. Ex. 5 / 16 | Comp. Ex. 6 / 17 |
|---|---|---|---|---|---|---|---|---|
| (A) | Hydrogen Peroxide*[1] | (% by mass) | 6 | 5.8 | 5.8 | 5.8 | 5.8 | 5.8 |
| (B) | Nitric Acid*[2] | (% by mass) | 4 | 4 | 4 | 4 | 4 | 4 |
| (C) | Fluoride Ion Source*[3] | (% by mass) | 0.1 | 0.25 | 0.25 | 0.25 | 0.15 | 0.2 |
| (D) | Azole*[4] | (% by mass) | 0.2 | 0.2 | — | 0.2 | 0.03 | 0.2 |
| (E) | Quaternary Ammonium Hydroxide*[5] | (% by mass) | — | — | 4.6 | 5.3 | — | — |
| (F) | Hydrogen Peroxide Stabilizer*[6] | (% by mass) | — | 0.03 | 0.03 | 0.03 | 0.03 | 0.03 |
| — | Ammonia*[12] | (% by mass) | 1.5 | 0.6 | — | — | 0.8 | — |
| — | Potassium Hydroxide*[13] | (% by mass) | — | — | — | — | — | 2.5 |
| | Water | (% by mass) | balance | balance | balance | balance | balance | balance |
| | pH | | 2.0 | 1.4 | 1.5 | 2.8 | 1.7 | 1.6 |
| | Taper Angle (initial bath/after dissolution) | | 33/35 | —/— | 75/— | 23/33 | —/— | 32/35 |
| | Top CD Loss (initial bath/after dissolution) | | 1.56/1.71 | —/— | 14.0/— | 2.48/1.80 | —/— | 2.10/2.14 |
| | Bottom CD Loss (initial bath/after dissolution) | | 0.80/0.92 | —/— | 13.5/— | 0.88/0.90 | —/— | 1.25/1.30 |
| | Barrier Film Tailing (initial bath/after dissolution) | | 0.20/0.22 | —/— | 0.25/— | 0.20/0.30 | —/— | 0.30/0.30 |
| | Evaluation of Bath Life (ppm) | | 500 | — | — | 200 | — | 2000 |
| | Glass Corrosion Rate (nm/min) | | 20 | — | — | 24 | — | 22 |

*[12]by Mitsubishi Gas Chemical
*[13]by Wako Pure Chemical Industry ppm or more. In Comparative Example 2, in which the etching liquid used did not contain the component (E) and its pH fell outside the range in the present invention, the etching rate was too high so that etching ununiformity was occurred and uniform etching could not be attained, and in addition, the wiring profile was not good and the taper angle and CD losses could not be measured. In Comparative Example 3, in which the etching liquid used did not contain the component (D), the etching rate was high so that the wiring profile could not be controlled and, in particular, the CD losses were large. In Comparative Example 4 in which the etching liquid used has a pH of 2.8 falling outside the range in the present invention, the bath life was short. In Comparative Example 5 in which the etching liquid used did not contain the component (E), the etching rate was too high, like in Comparative Example 2, so that there occurred etching mottle and uniform etching could not be attained, and in addition, the wiring profile was not good and the taper angle and the CD losses could not be measured. In Comparative Example 6 in which the etching liquid used did not contain the component (E) like in Comparative Example 5, the taper angle and the CD loss values were on an acceptable level, but the bath life was short.

INDUSTRIAL APPLICABILITY

The etching liquid of the present invention can be favorably used for etching of a multilayer thin film containing a copper layer and a titanium layer, especially such a multilayer thin film in which the copper layer is laminated on the titanium layer; and according to the etching method of using the etching liquid, a multilayer thin film containing a copper layer and a titanium layer can be etched all at a time to have a good wiring profile after etching, therefore realizing high producibility.

The invention claimed is:

1. An etching liquid, consisting of:
   (A) from 4.5 to 7.5% by mass of hydrogen peroxide;
   (B) from 3 to 6% by mass of nitric acid;
   (C) from 0.1 to 0.5% by mass of a fluoride ion source;
   (D) from 0.1 to 0.5% by mass of an azole;
   (E) from 3 to 6% by mass of a quaternary ammonium hydroxide; and
   (F) from 0.01 to 0.1% by mass of a hydrogen peroxide stabilizer,
   wherein the etching liquid has a pH of from 1.5 to 2.5.

2. The etching liquid of claim 1, wherein the fluoride ion source (C) is ammonium fluoride, acidic ammonium fluoride, or a mixture thereof.

3. The etching liquid of claim 2, wherein the azole (D) is 5-amino-1H-tetrazole.

4. The etching liquid of claim 2, wherein the quaternary ammonium hydroxide (E) is tetraalkylammonium hydroxide, (hydroxyalkyl)trialkylammonium hydroxide, or a mixture thereof.

5. The etching liquid of claim 2, wherein the hydrogen peroxide stabilizer (F) is phenylurea, phenolsulfonic acid, or a mixture thereof.

6. The etching liquid of claim 1, wherein the azole (D) is 5-amino-1H-tetrazole.

7. The etching liquid of claim 6, wherein the fluoride ion source (C) is ammonium fluoride, acidic ammonium fluoride, or a mixture thereof.

8. The etching liquid of claim 6, wherein the quaternary ammonium hydroxide (E) is tetraalkylammonium hydroxide, (hydroxyalkyl)trialkylammonium hydroxide, or a mixture thereof.

9. The etching liquid of claim 8, wherein the hydrogen peroxide stabilizer (F) is phenylurea, phenolsulfonic acid, or a mixture thereof.

10. The etching liquid of claim 1, wherein the quaternary ammonium hydroxide (E) is tetraalkylammonium hydroxide, (hydroxyalkyl)trialkylammonium hydroxide, or a mixture thereof.

11. The etching liquid of claim 10, wherein the azole (D) is 5-amino-1H-tetrazole.

12. The etching liquid of claim 1, wherein the hydrogen peroxide stabilizer (F) is phenylurea, phenolsulfonic acid, or a mixture thereof.

13. The etching liquid of claim 1, being suitable for etching a multilayer thin film comprising a copper layer and a titanium layer, wherein the multilayer thin film is obtained by laminating the copper layer on the titanium layer.

14. A method for etching a multilayer thin film comprising a copper layer and a titanium layer, the method comprising:
   contacting a subject to be etched with the etching liquid of claim 1.

15. The method of claim 14, wherein the multilayer thin film is obtained by laminating a copper layer on a titanium layer.

16. A method for etching a multilayer thin film comprising a copper layer and a titanium layer, the method comprising:
   contacting a subject to be etched with the etching liquid of claim 1.

17. A method for etching a multilayer thin film comprising a copper layer and a titanium layer, the method comprising:
   contacting a subject to be etched with the etching liquid of claim 11.

18. A method for etching a multilayer thin film comprising a copper layer and a titanium layer, the method comprising:
   contacting a subject to be etched with the etching liquid of claim 9.

* * * * *